United States Patent
Schmitt et al.

(10) Patent No.: US 6,358,323 B1
(45) Date of Patent: *Mar. 19, 2002

(54) METHOD AND APPARATUS FOR IMPROVED CONTROL OF PROCESS AND PURGE MATERIAL IN A SUBSTRATE PROCESSING SYSTEM

(75) Inventors: John Schmitt, Sunnyvale; Frank P. Chang, San Jose; Xin Shen Guo, Los Altos Hills; Ling Chen, Sunnyvale; Christophe Marcadal, Santa Clara, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/120,004

(22) Filed: Jul. 21, 1998

(51) Int. Cl.[7] .............................................. C23C 16/00
(52) U.S. Cl. ....................................... 118/726; 118/715
(58) Field of Search .................................. 118/715, 726

(56) References Cited

U.S. PATENT DOCUMENTS

| | | | | |
|---|---|---|---|---|
| 4,505,948 A | * | 3/1985 | Pinkhasov .................... | 427/37 |
| 4,512,867 A | * | 4/1985 | Andreev et al. ............. | 204/298 |
| 4,678,679 A | | 7/1987 | Ovshinsky ................... | 427/38 |
| 4,718,976 A | | 1/1988 | Fujimura .................... | 156/643 |
| 4,718,985 A | * | 1/1988 | Kjellander .................. | 202/172 |
| 4,848,273 A | * | 7/1989 | Mori et al. .................. | 118/729 |
| 5,010,842 A | | 4/1991 | Oda et al. ................... | 118/723 |
| 5,019,531 A | | 5/1991 | Awaya et al. ............... | 437/180 |
| 5,186,120 A | * | 2/1993 | Ohnishi et al. ............. | 118/667 |
| 5,203,925 A | * | 4/1993 | Shibuya et al. ............. | 118/724 |
| 5,268,034 A | | 12/1993 | Vukelic ...................... | 118/719 |
| 5,451,260 A | | 9/1995 | Versteeg et al. ............ | 118/725 |
| 5,462,014 A | * | 10/1995 | Awaya et al. ............... | 118/725 |
| 5,503,678 A | * | 4/1996 | Usami ........................ | 118/724 |
| 5,505,781 A | * | 4/1996 | Omori et al. ............... | 118/726 |
| 5,505,782 A | * | 4/1996 | Stauffer ..................... | 118/726 |
| 5,580,822 A | * | 12/1996 | Hayakawa et al. ......... | 437/187 |
| 5,616,208 A | * | 4/1997 | Lee ........................... | 156/345 |
| 5,744,192 A | | 4/1998 | Nguyen et al. .............. | 427/99 |
| 5,895,530 A | * | 4/1999 | Shrotriya et al. ........... | 118/715 |
| 6,110,556 A | * | 8/2000 | Bang et al. ................. | 428/64.1 |

FOREIGN PATENT DOCUMENTS

EP                0 799 907              10/1997         .......... C23C/16/44

* cited by examiner

*Primary Examiner*—Jeffrie R. Lund
(74) *Attorney, Agent, or Firm*—Moser, Patterson & Sheridan, LLP

(57) ABSTRACT

A deposition system for performing chemical vapor deposition comprising deposition chamber having a lid and a vaporizer attached to the lid is provided. Additionally, one or more valves disposed between the lid and the vaporizer to limit the flow of precursor material to the chamber and to improve purging of a precursor material delivery system attached to the vaporizer. The precursor delivery system has one or more conduction lines. One of the conduction lines is a flexible conduction line in the form of a multiple turn coil having a torsional elasticity suitable for allowing detachment of the lid from the chamber without having to break or disassemble a conduction line. Preferably, the flexible conduction line is a thirty (30) turn coil having a diameter of approximately three (3) inches fabricated from stainless steel tubing. Alternately, the flexible conduction line is made from a permeable membrane material such as a fluorocarbon compound such as TEFLON®, a fluorocarbon containing compound or PFA 440-HP which is then encased in a sheath. The sheath is connected to a pressure control unit to allow degassing of the conduction lines and space between the conduction lines and sheath.

18 Claims, 8 Drawing Sheets

METHOD AND APPARATUS FOR IMPROVED CONTROL OF PROCESS AND PURGE MATERIAL IN A SUBSTRATE PROCESSING SYSTEM

BACKGROUND OF THE DISCLOSURE

1. Field of the Invention

The present invention is directed toward the field of manufacturing integrated circuits. The invention is more particularly directed toward an improved method and apparatus for introducing process and purge material in a deposition process system.

2. Description of the Related Art

Presently, aluminum is widely employed in integrated circuits as an interconnect, such as plugs and vias. However, higher device densities, faster operating frequencies, and larger die sizes have created a need for a metal with lower resistivity than aluminum to be used in interconnect structures. The lower resistivity of copper makes it an attractive candidate for replacing aluminum.

There are two well established techniques for depositing copper, chemical vapor deposition ("CVD") and physical vapor deposition ("PVD"). A CVD process is desirable because it provides for a more conformally deposited layer. For example, chemical vapor deposition of copper is achieved by using a precursor known as CUPRASELECT®, which has the formula Cu(hfac)L. CUPRASELECT® is a registered trademark of Schumacher of Carlsbad, Calif. The CUPRASELECT® consists of copper (Cu) bonded to a deposition controlling compound such as (hfac) and a thermal stabilizing compound (L). The (hfac) represents hexafluoroacetylacetonato, and (L) represents a ligand base compound, such as trimethylvinylsilane ("TMVS").

During the CVD of copper using Cu(hfac)L, the precursor is vaporized and flowed into a deposition chamber containing a wafer. In the chamber, the precursor is infused with thermal energy at the wafer's surface. At the desired temperature the following reaction results:

$$2\ \text{Cu(hfac)L} \rightarrow \text{Cu} + \text{Cu(hfac)}_2 + 2\text{L} \qquad \text{(Eqn. 1)}$$

The resulting copper (Cu) deposits on the upper surface of the wafer. The byproducts of the reaction (i.e., Cu(hfac)$_2$ and (2L) are purged from the chamber which is maintained at a vacuum during wafer processing.

One problem associated with using CUPRASELECT® for CVD is the delivery of the material from its liquid storage ampoule to the process chamber in which the CVD occurs. Typically, the liquid CUPRASELECT® must first be vaporized and mixed with a carrier gas such as Argon, Helium or any other inert gas between the ampoule and the process chamber. Vaporizers are incorporated into the delivery system and function by altering one of two environmental conditions (temperature or pressure). Most vaporizers raise the temperature of the precursor to establish the desired state change. Unfortunately, raising the temperature too high can cause breakdown of the precursor and subsequent plating (deposition) in transfer lines between the ampoule and process chamber. One example is a CEM vaporizer manufactured by Bronkhurst of the Netherlands used to vaporize the precursor liquid. Unfortunately, these devices clog after vaporizing only about 50–1500 g of CUPRASELECT®. For wafer manufacturing applications, the vaporization rate must be repeatable from wafer to wafer.

After vaporization, CUPRASELECT® is pumped into the process chamber along with the carrier gas such as Argon, Helium or any other inert gas. This pumping action tends to pull a high concentration of TMVS out of the Cupraselect leaving the less stable copper and (hfac) in the transfer lines between the ampoule, delivery system and process chamber. Under these conditions, undesirable plating or deposition is also likely to occur at important locations. For example, plating can occur near the vaporizer, valves, process chamber showerhead orifices and the like. Plating changes the dimensions of these critical system components which degrades performance of the chamber and the resultant deposition layer. Additionally, unwanted plating may flake off during the deposition process which can render a processed wafer faulty or unusable. A maintenance cycle would then have to be run on the process chamber to replace or clean the chamber which reduces wafer throughput.

To provide for repeatable deposition conditions, it is desirable to create the precursor vapor as close to the process chamber as possible to minimize the likelihood of deposition at any point in the delivery system, to reduce the time and cost of purging the process chamber and most importantly, to reduce pressure gradients in the deposition system. Pressure gradients occur when friction forces act upon the vapor (i.e., along the inner surfaces of vessels and conduits through which the vapor travels). Low pressure is desired in the vaporizer because the efficiency of the vaporizer (and thus, throughput) is limited by pressure. Additionally, the components used to deliver the precursor should be minimized so as to reduce cost and facilitate complete purging of the system when so needed.

Accordingly, it is desirable to provide an apparatus and method for improved control of a precursor material in a substrate process system to reduce the likelihood of plating or particle formation within the system as well as increase deposition rate.

SUMMARY OF THE INVENTION

The disadvantages associated with the prior art are overcome with the present invention of an apparatus that allows for improved delivery and vaporization of precursor material. Specifically, a deposition system for performing chemical vapor deposition comprising a deposition chamber having a lid and a vaporizer attached to the lid is provided. Additionally, one or more valves are disposed between the lid and the vaporizer to limit the flow of precursor material to the chamber and to improve purging of a precursor material delivery system attached to the vaporizer. The precursor delivery system has one or more conduction lines. One of the conduction lines is a flexible conduction line in the form of a multiple turn coil having a torsional elasticity suitable for allowing detachment of the lid and vaporizer from the chamber without having to break or disassemble a precursor (liquid) conduction line. Preferably, the flexible conduction line is a thirty (30) turn coil having a diameter of approximately three (3) inches fabricated from ⅛" stainless steel tubing.

Alternately, the flexible conduction line is made from a permeable membrane material such as fluorocarbon compound such as TEFLON®, a fluorocarbon containing compound, or PFA 440-HP which is then encased in a sheath. The sheath is connected at a first end to the vaporizer and at a second end to a pressure control unit via a valve to allow degassing of the conduction lines and space between the conduction lines and sheath.

The deposition system may also contain additional features such as a pre-warm module to warm a precursor material flowing through the conductance lines prior reaching the vaporizer, a shadow plate disposed over a showerhead in the chamber and an precursor material injection system in the chamber. All of these features lead to improved vaporization and deposition rate of the precursor material and allow for lower pressure operating regimes in the chamber. As such, there is a reduced tendency for the precursor material to break down and undesirably deposit or form particles in the system (i.e., anywhere besides on the substrate to be processed). Hence, system reliability and repeatability is improved.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The novel features of the present invention provide for the delivery of a precursor material (i.e., CUPRASELECT® for copper CVD) to a deposition system in a controlled fashion without compromising or unduly adding to the complexity of the system. Such features also provide for lower operating pressures, improved deposition rate and throughput of the system. The subject invention inhibits the formation of particles on the interior of the precursor transfer lines and the chamber. The improved delivery system is arranged such that the precursor can be easily purged from the transfer lines so that the delivery of process material is precisely repeated for each deposition. Although the invention is described in terms of copper thin films grown by CVD, those skilled in the art will recognize that the invention may be applied to any thin film deposition process where it is desirable to maintain controlled and repeatable delivery of process material to improve the resultant film and reduce contamination levels in the system.

Figure 1:
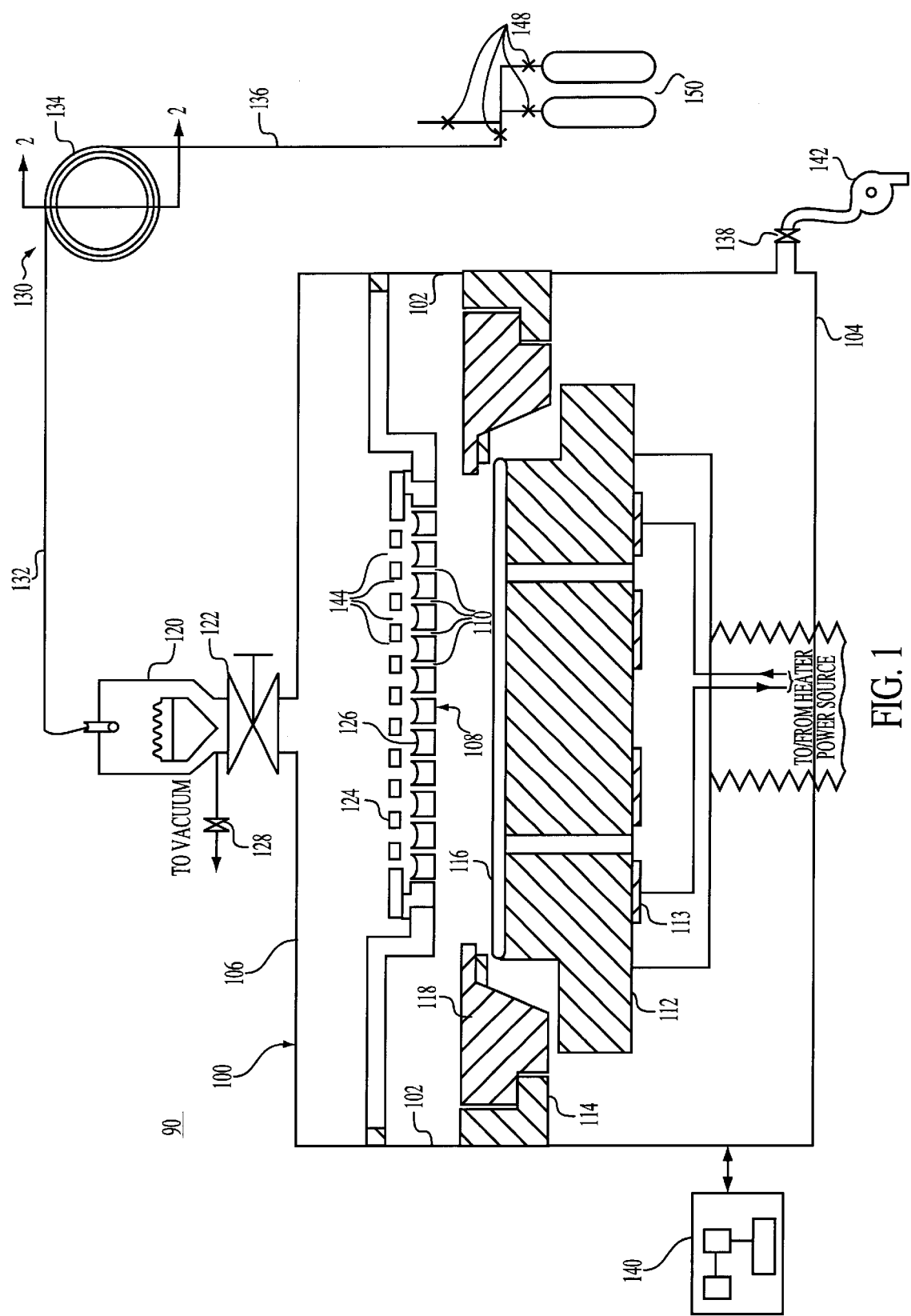
FIG. 1 illustrates a schematic of a first embodiment of a CVD copper deposition system of the present invention.

A first embodiment of the apparatus of the present invention is depicted in FIG. 1. Specifically, a deposition system 90, comprises a deposition chamber 100, a vaporizer 120, a precursor delivery system 130 and a control system 140. One example of a deposition chamber that can be used is a model WxZ chamber manufactured by Applied Materials, Inc. of Santa Clara, Calif., that is modified to perform copper deposition in accordance with the invention. In a preferred embodiment, the invention incorporates the use the precursor CUPRASELECT®. This however does not preclude the use of other precursors and additives that are well known to those skilled in the art of CVD.

The chamber 100 is defined by sidewalls 102, floor 104 and lid 106. The lid 106 incorporates a showerhead 108 having a plurality of orifices 110 therein. The deposition chamber 100 further contains a heated susceptor 112 for retaining a substrate 116 such as a semiconductor wafer onto which it is desirable to deposit copper. The susceptor 112 is fabricated from a durable metallic material such as aluminum or a ceramic such as aluminum nitride or boron nitride. The susceptor 112 also functions as a heater or heat sink and contains additional components to heat or draw heat from the wafer 116. For example, the susceptor 112 can be provided with one or more resistive heater coils 113 which are connected to a power source (not shown). The power source provides a current flow through the coil 113 which generates heat within the substrate support 112 which is then conducted to the wafer 116. An annular plate 114 circumscribes the chamber walls 102 and provides support for a cover ring 118. Copper is deposited onto the substrate 116 by CVD when a vaporized precursor contacts the heated wafer as explained in greater detail below. Cover ring 118 provides protection to peripheral portions of the substrate 116 and lower chamber regions upon which deposition is undesirable. A pressure control unit 142, (e.g., a vacuum pump), is coupled to the process chamber 100 via a valve 138 (e.g., a throttle valve) to control the chamber pressure.

Figure 2:
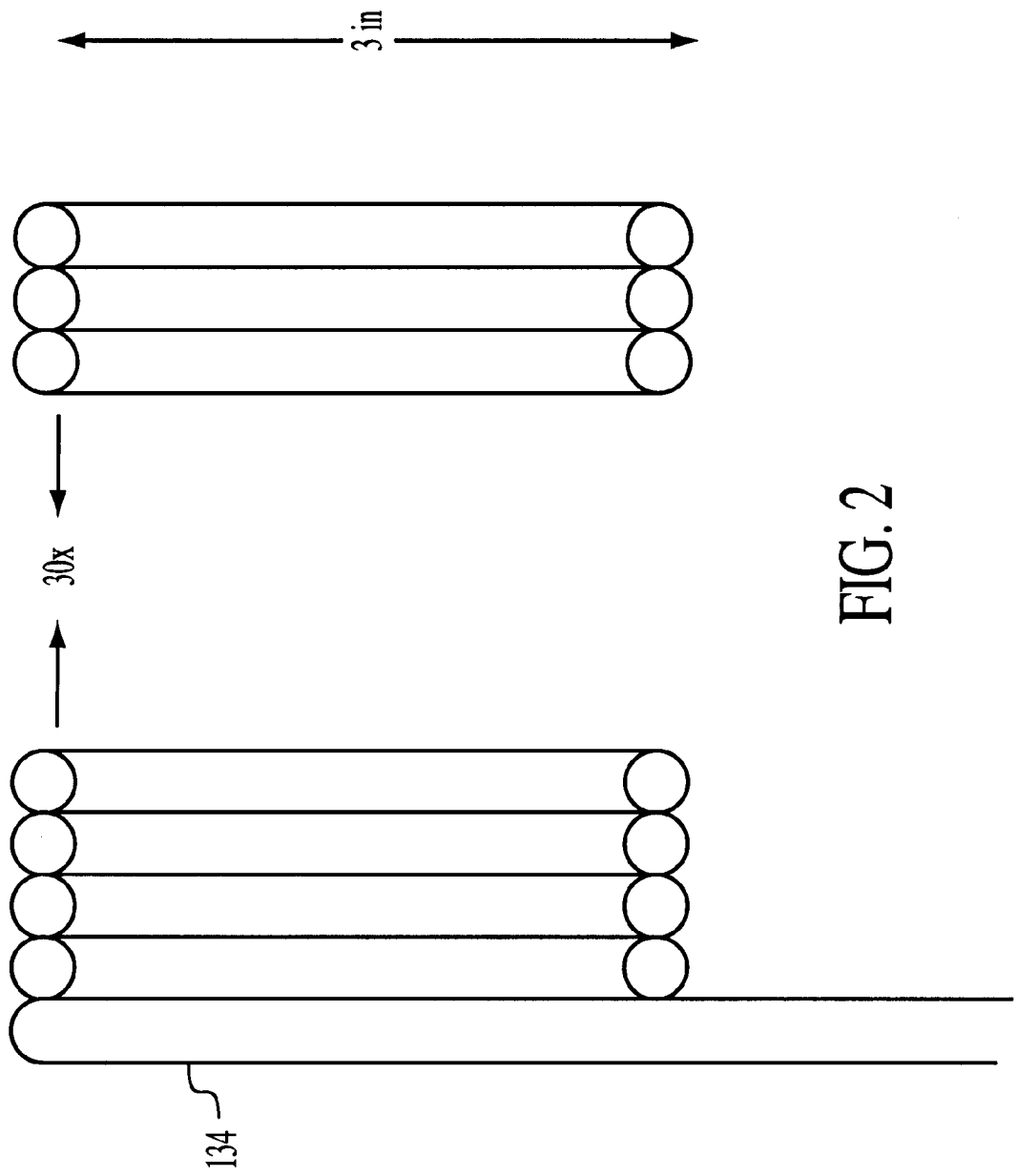
FIG. 2 illustrates a cross-sectional view of a flex conduction line of the deposition system as seen along lines 2—2 of FIG. 1.

In one example of the precursor delivery system 130, a precursor material, such as liquid CUPRASELECT® is delivered from one of the process material sources 150 through one or more valves 148 to a fixed conduction line 136. The fixed conduction line 136 is connected to a flex conduction line 134 and explained in greater detail below. The flex conduction line 134 is connected to a vaporizer conduction line 132 which is also connected to the vaporizer 120. The vaporizer 120 is in turn connected to the lid 106 of the chamber 100. The arrangement of conduction lines 132, 134 and 136 is extremely practical in that it allows for the uninterrupted connection of a liquid precursor source, to the vaporizer and chamber. In a preferred embodiment of the invention, the conduction lines 132, 134 and 136 are a single, continuous length of ⅛ in. diameter stainless steel (SST) tubing. A cross-sectional view of the flex conduction line 134 is shown in FIG. 2. The flex conduction line 134 portion of the SST tubing is preferably a coil of approximately thirty (30) turns having a 3 inch. diameter. The resultant coil retains a torsional elasticity that is useful for reason described in greater detail below. Although a thirty-turn, 3 inch diameter coil is described, other combinations of turns or diameter may be used to create the desired coil and elasticity.

With the precursor delivery system as shown and described, maintenance of the chamber 100 is facilitated without undue concern for weakening or breaking a liquid transfer line from an external source. Specifically, when the chamber 100 is opened and the lid 106 detached therefrom, the torsional elasticity of the flex conduction line 134 allows for hinging of the lid 106 and vaporizer 120 (and attended connected components described above) away from the chamber 100 as a single unit without severing or otherwise damaging liquid transfer lines (e.g., the tubing). That is, the coiling of the flex conduction line 134 allows for a small yet effective elastic deformation of the tubing. When maintenance on the chamber 100 is completed, the lid 106 is hinged down and secured to the chamber 100 without the need to reconnect or reattach transfer lines. As such, transfer lines are less likely to be directly exposed to airborne contaminants which can affect flow of materials in the transfer lines and valves therebetween.

Alternately, the conduction lines 132, 134 and 136 may be fabricated from TEFLON®, manufactured by DuPont, a TEFLON® variant or other suitable permeable membrane material such as PFA 440-HP manufactured by Swagelock. As such, the conduction lines 132, 134 and 136 can form a degasser also. Specifically, if bubbles form in the liquid precursor, as a result of diffusion of a push gas (such as Helium), then the conduction lines 132, 134 and 136 can act as a selective membrane, and allow for the Helium to diffuse through and be removed from the liquid stream.

Figure 3:
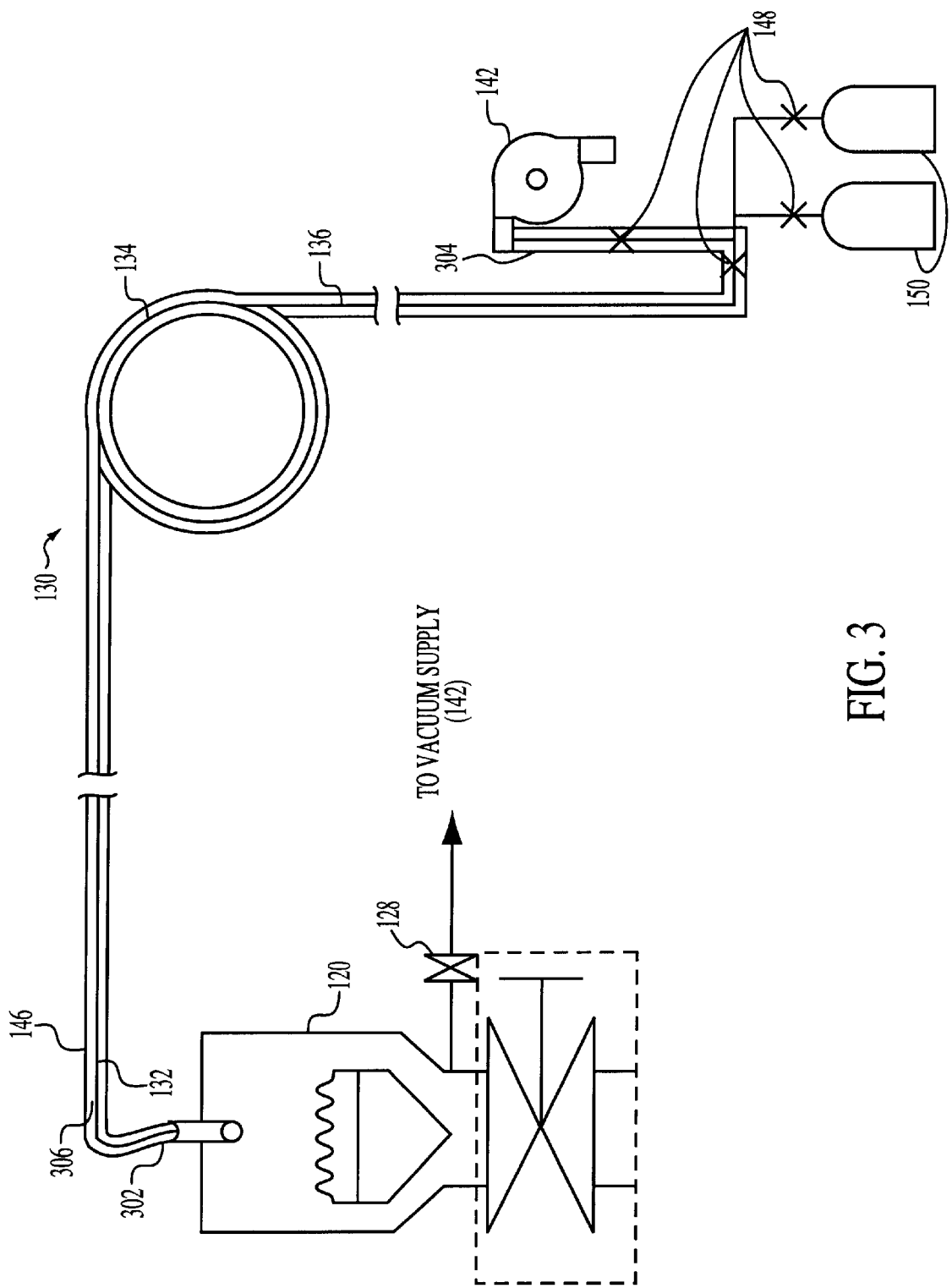
FIG. 3 illustrates a precursor delivery system portion of the deposition system.

FIG. 3 depicts yet another embodiment of the invention wherein the conduction lines 132, 134 and 136 fabricated of a permeable material are further encased in a shroud or sheath 146. The shroud is sealed at a first end 302 by the vaporizer 120 and at a second end 304 by the pressure control unit 142 or other similar device for pumping a space 306 between the shroud 146 and the conduction lines 132, 134 and 136. In this manner, pumping the space 306 to a vacuum allows any bubbles in the conduction lines to degas through the permeable membrane and out of the system 130. Voiding the conduction lines is important as it increases the repeatability of delivery of the liquid precursor. That is, a steady flow is maintained in the conduction lines instead of an undesirable intermittent or turbulent flow caused by the bubbles. Additionally, while degassing we retain the advantage of having an unbroken liquid line reduces the formation of particles which can form at connections and enhances the purging capability of the delivery system 130. The reduced amount of components results in low production costs while maintaining reliability.

Figure 7:
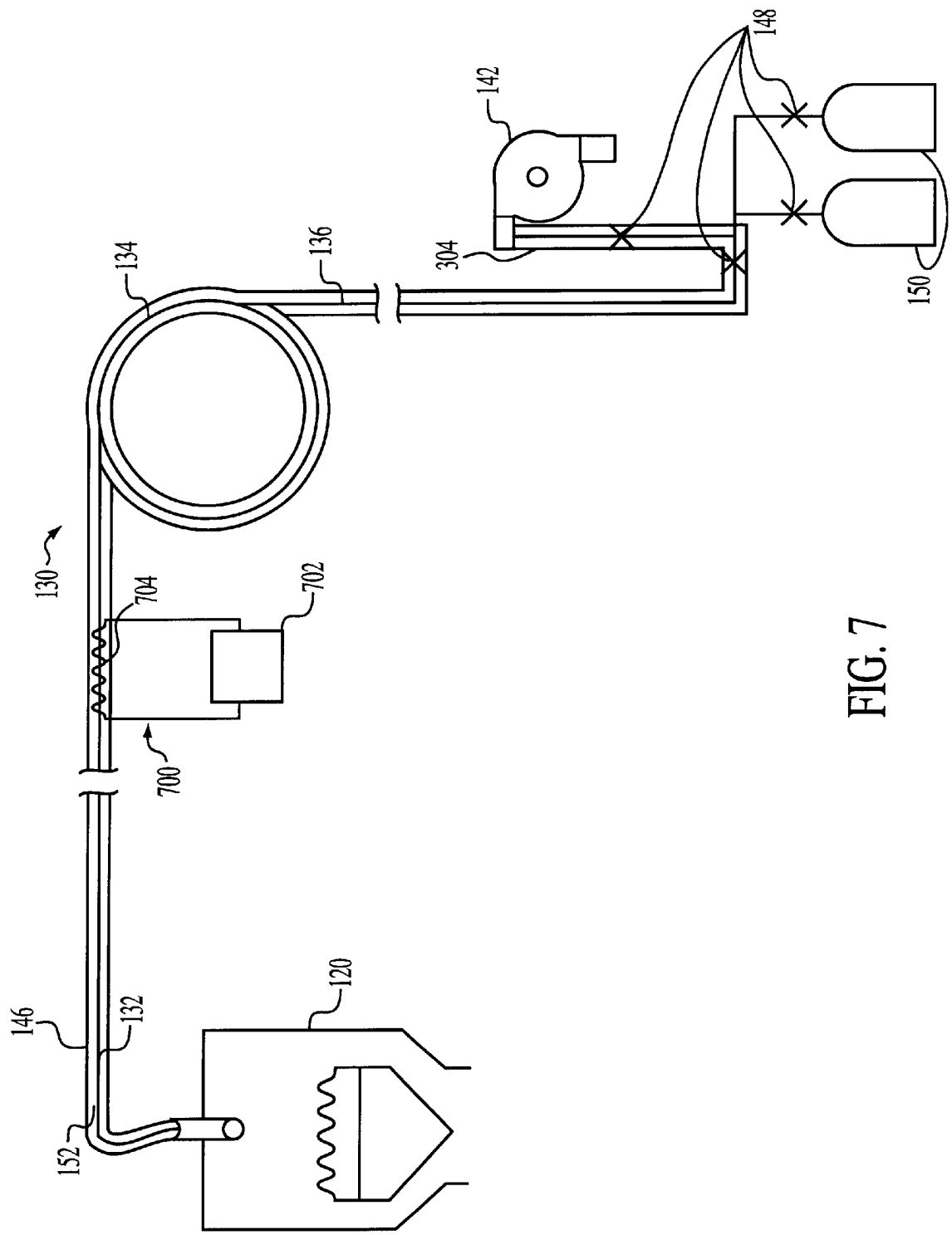
FIG. 7 illustrates a further improvement to the precursor delivery system.

A further improvement to the precursor delivery system 130 includes the ability to pre-warm the precursor material and is depicted schematically in FIG. 7. Pre-warming the precursor material is desirable because it allows for more rapid vaporization at the vaporizer 120. Such condition is achieved by a pre-warm module 700 located in the precursor delivery system 130. Specifically, the pre-warm module has a heating means 704 (i.e., a coil) communicating with one or more of the conductance lines 132, 134 and 136. The heating means is further connected to a power supply 702. The power supply 702 may be AC or DC and of any power output capable of raising the temperature of the precursor material in the conductance lines 132, 134 or 136 to a temperature above room temperature (20° C.) but below the vaporizer temperature (approx. 60–65° C.). In a preferred embodiment the pre-warm temperature is approximately 40° C. At 40° C., the precursor material remains chemically stable yet excited closer to the point of vaporization prior to entering the vaporizer 120. As such, decomposition and subsequent plating of the precursor is not likely to occur in the precursor delivery system 130 and vaporizes rapidly upon entering the vaporizer 120.

Further seen in FIG. 1 and optionally included in the system 90 is a valve 122 between the vaporizer 120 and the lid 106. Specifically, valve 122 is a high conductance gate valve for controlling the flow of vaporized precursor and carrier material from the vaporizer 120 to the chamber 100. That is, liquid precursor delivered via delivery system 130 enters and is vaporized by the vaporizer 120. An example of a suitable vaporizer is discussed in a commonly assigned patent application entitled "Chemical Vapor Deposition Vaporizer" authored by Frank Chang, Charles Dornfest, Xiaoliang Jin, Lee Luo having application Ser. No. 09/352, 692. Vaporized precursor and carrier gas flow through the valve 122 and to the showerhead 108. The precursor and carrier gas are delivered to a wafer 116 retained on the susceptor 112 through the showerhead 108. The proximity of the vaporizer 120 and valve 122 to the chamber is advantageous as the vapor created does not have to travel over a large distance before dispersion into the chamber. As such, less plating or clogging of transfer lines is likely. Moreover, the close proximity of the vaporizer 120 to the chamber 100 significantly reduces the likelihood of pressure gradients that affect the deposition process. For example, if the deposition system 80 is operating at a pressure of 1.5 torr, a 0.5 torr drop in pressure is significant enough to degrade the properties of the film being deposited. Additionally, the proximity of the valve 122 provides for faster processing of wafers by closing the chamber 100 to deposition material without a time lag associated with a valve further from the chamber. Byproducts of the deposition process can be pumped out of just the chamber instead of the extra volume of the delivery system also. Less excess process material is carried to the chamber which results in less extraneous deposition on chamber components and cross-contamination of neighboring chambers during wafer transfer. The high conductance aspect of the valve 122 allows for quick pumping or purging of the conductive lines 132, 134 and 136 as well as the chamber 100. Alternately, the high conductance gate valve can be replaced with a high conductance isolation valve to achieve the same results. Further, a separate isolation valve 128 is positioned between the vaporizer 120 and the valve 122 to allow for rapid purging of the delivery system 130.

Figure 4:
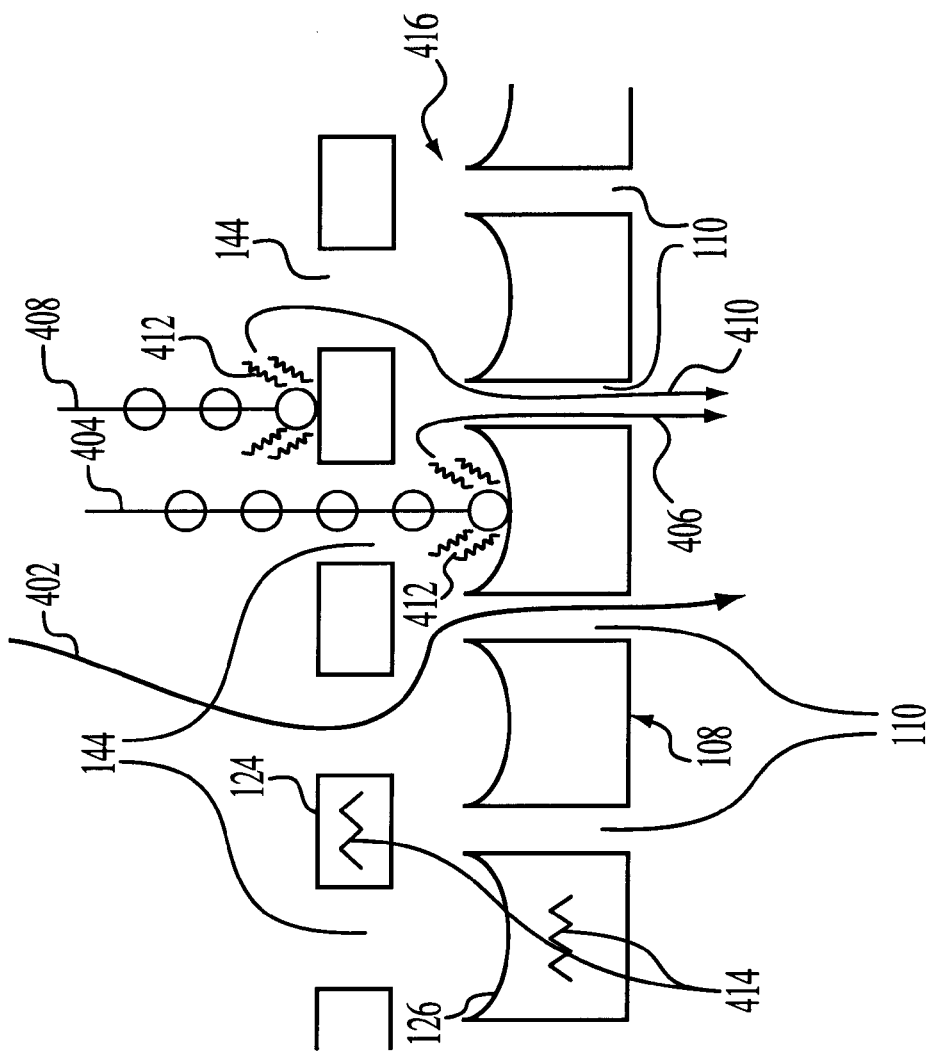
FIG. 4 illustrates a detailed view of a showerhead and shadow plate of the subject invention.

The showerhead 108 further comprises another novel aspect of the subject deposition system 90. Specifically, the showerhead 108 is fabricated to serve not only as a distribution plate for the vaporized precursor and carrier materials, but also as secondary "hot plate" to catch and revaporize excess process material. The showerhead 108 performs this function by way of a plurality of concave segments 126 formed on a lid surface 416 of the showerhead 108 and a shadow plate 124 disposed above the showerhead 108. FIG. 4 depicts a close-up view of the showerhead 108 wherein the flow of vapor and incompletely vaporized liquid is shown. Specifically, a flow of completely vaporized process material 402 passes from the vaporizer 120 and valve 122 (see FIG. 1) and into the chamber 100. The flow 402 continues through a plurality of orifices 144 provided in the shadow plate 124 and through the plurality of orifices 110 in the showerhead 108. The shadow plate orifices 144 are offset from the showerhead orifices 110 to reduce liquid precursor contamination. Specifically, a first flow 404 of an incompletely vaporized (liquid) material passes through the vaporizer 120 and valve 122 and is caught by one of the concave portions 126 on the top of the showerhead 108. The showerhead 108 and shadow plate 124 are heated to approximately 65° C. which is a temperature suitable for vaporization of the liquid precursor material (i.e., CUPRA-SELECT®. The heating is accomplished by any known and accepted means for chamber component heating such as, but not limited to, fluid exchange with fluid remotely heated, resistive heating elements 414 contained in or upon the showerhead 108 and/or shadow plate 124, heat lamps (not shown) within the chamber 100 or the like). As such, the liquid material vaporizes 412 and follows a path 406 through one of the plurality of orifices 110 in the showerhead 108. The flow of incompletely vaporized material can also occur along path 408, become vaporized 412 on the shadow plate 124 and continue as a vaporized flow along path 410. In theory, the improved showerhead 108 and shadow plate prevent the flow of liquid material to the wafer surface by capturing and secondarily vaporizing such liquid.

Figure 5:
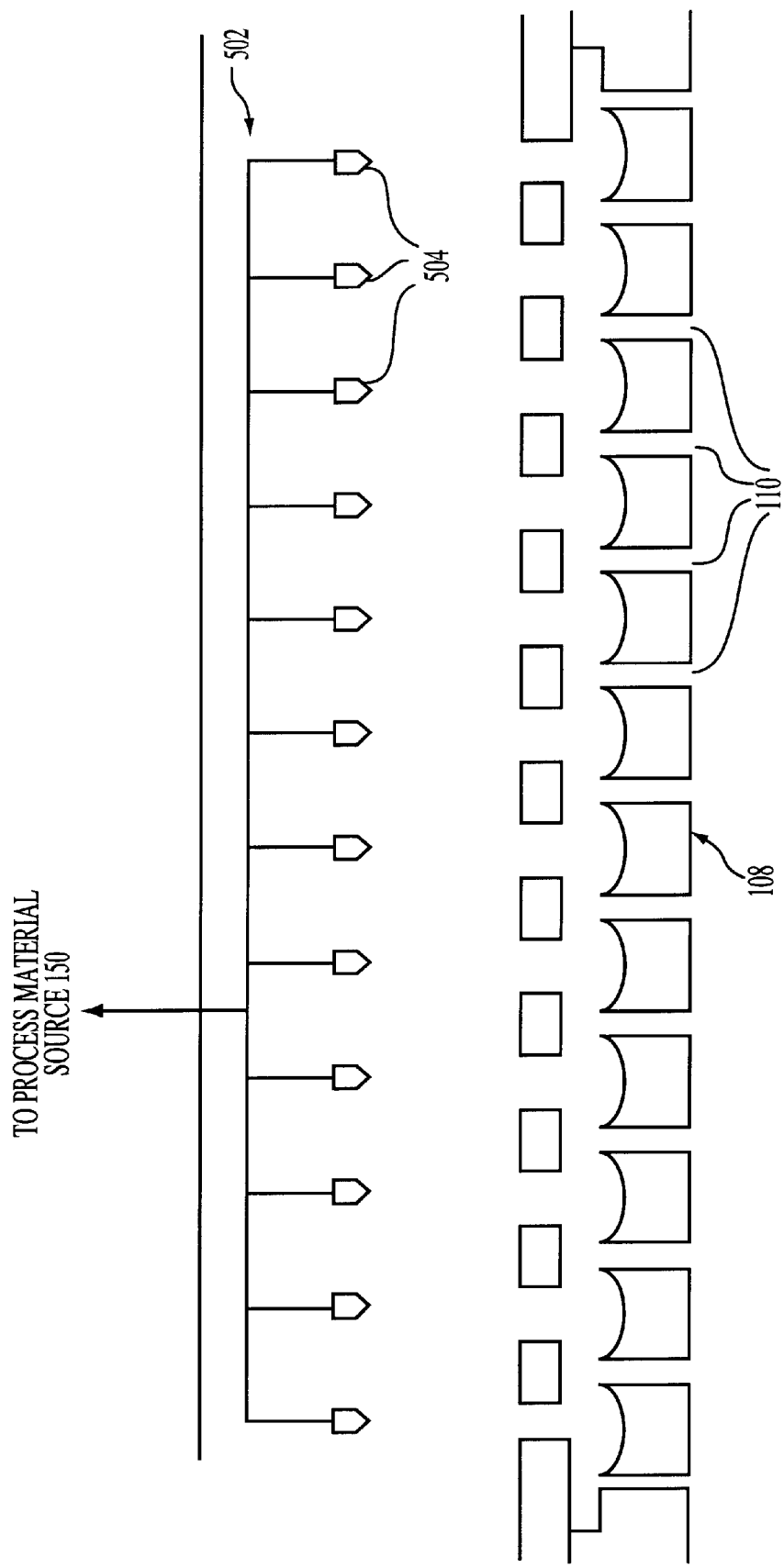
FIG. 5 illustrates an alternate embodiment of the subject invention incorporating an injection system above the showerhead and shadow plate.

FIG. 5 depicts an alternate embodiment of the deposition system 90 wherein an injection system 502 is incorporated into the chamber to facilitate dispersion of the vaporized process material. Specifically, in this alternate embodiment, there is a plurality of injectors 504 disposed below the lid 106 connected to one or more of the liquid process material sources 150. The shadow plate 124 is heated and thereby replaces the need for a separate hot surface such as a hot plate inside the vaporizer. As such, a more uniform dispersion pattern of vaporized process material is created above the showerhead 108. Further benefits of the injection system 502 are increased flow rate and vaporization rate of the precursor material.

Figure 6B:
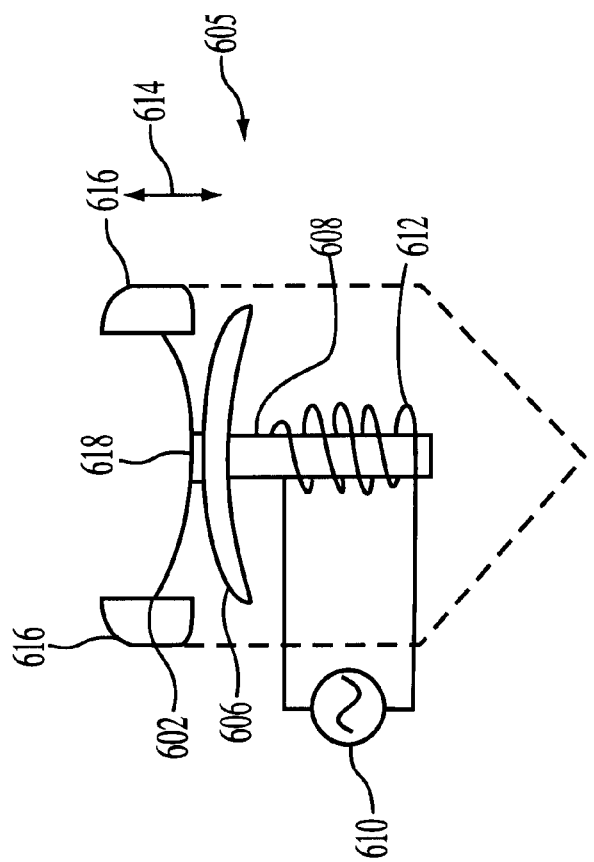
FIGS. 6a and 6b illustrate detailed views of an alternate embodiment of the vaporizer.
Figure 6A:
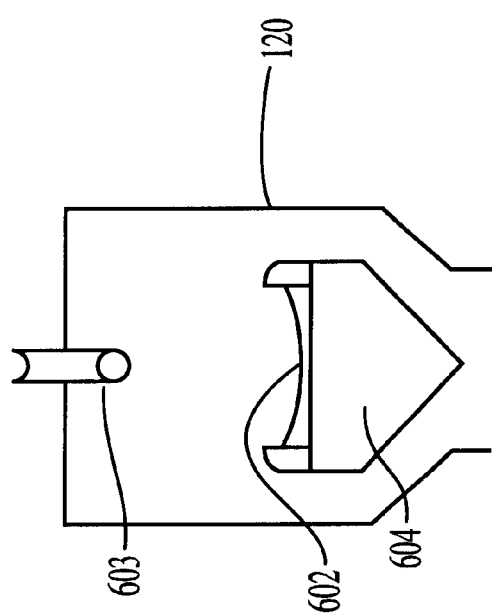

Further to the subject invention is an improved vaporizer 120 which is seen in greater detail in FIGS. 6a and 6b. Specifically, the vaporizer 120 houses a hotplate 602 for imparting thermal energy (via connection to a power source, not shown) to atomized liquid precursor. The atomized liquid precursor enters the vaporizer 120 from a nozzle 603 that is connected to conductance line 132 (see FIG. 1). The hotplate 602 is concave and supported by a base 604 which contains the necessary electrical and physical connections to allow the hotplate to function. These precise elements are considered outside of the scope of the present invention. The commonly assigned exemplary vaporizer may incorporate the improvement discussed in the embodiment. As liquid precursor material strikes the hotplate 602, most of the material is vaporized. However, small droplets may remain on the hotplate 602 if the instantaneous thermal energy available is insufficient to effect the desired state change. That is, as precursor is vaporized, the thermal energy of the hotplate is converted into kinetic energy of the precursor thereby reducing the available thermal energy for further vaporization.

To improve vaporization, it is desirable to increase the surface area of the liquid. One means for increasing the surface area is by vibrating the hotplate 602. Specifically, the hotplate is attached to a vibrator 605 (see FIG. 6b) that is shielded from the process environment. The vibrator 605 is fabricated from a shaft-mounted diaphram 606 below the hotplate 602. The shaft portion 608 of the diaphram 606 is surrounded by a coil 612. The coil 612 is in turn connected to an AC power supply 610. The AC power supply 610 may be contained within the base 604 or remotely disposed. Further, the power supply 610 operates in the high frequency range and preferably between about 200 Hz–6 KHz frequency range. A high frequency element 618 couples the diaphragm 606 to the hotplate 602. A support ring 616 flexibly retains the hotplate 602 above the base. As such, the diaphram 606 and hotplate 602 rapidly oscillate in a vertical manner as depicted by arrows 614. This vertical motion increases the mobility of the droplets and hence the available surface area for vaporization to occur.

An improved method for performing CVD of CUPRA-SELECT® is also described as part of the subject invention. Specifically, overheating the hotplate 602 greatly increases the vaporization of precursor material. That is, precursor material enters the vaporizer 120 from a remote source. The hotplate is overheated (heated to a temperature at least 50° C. higher than that of the decomposition temperature of the precursor). In a preferred embodiment, the hotplate temperature is in the range of approximately 70–210° C. (the decomposition temperature of CUPRASELECT® is approximately 60–65° C.). The resultant thermal energy imparted to the precursor material fully vaporizes it which greatly reduces the likelihood of condensation or droplet formation in the chamber 100. Some plating or deposition of precursor material may occur on the hotplate or interior surfaces of the vaporizer 120, but the vaporizer 120 is a highly and easily serviceable component which does not contribute greatly to fabrication process downtime.

Figure 8:
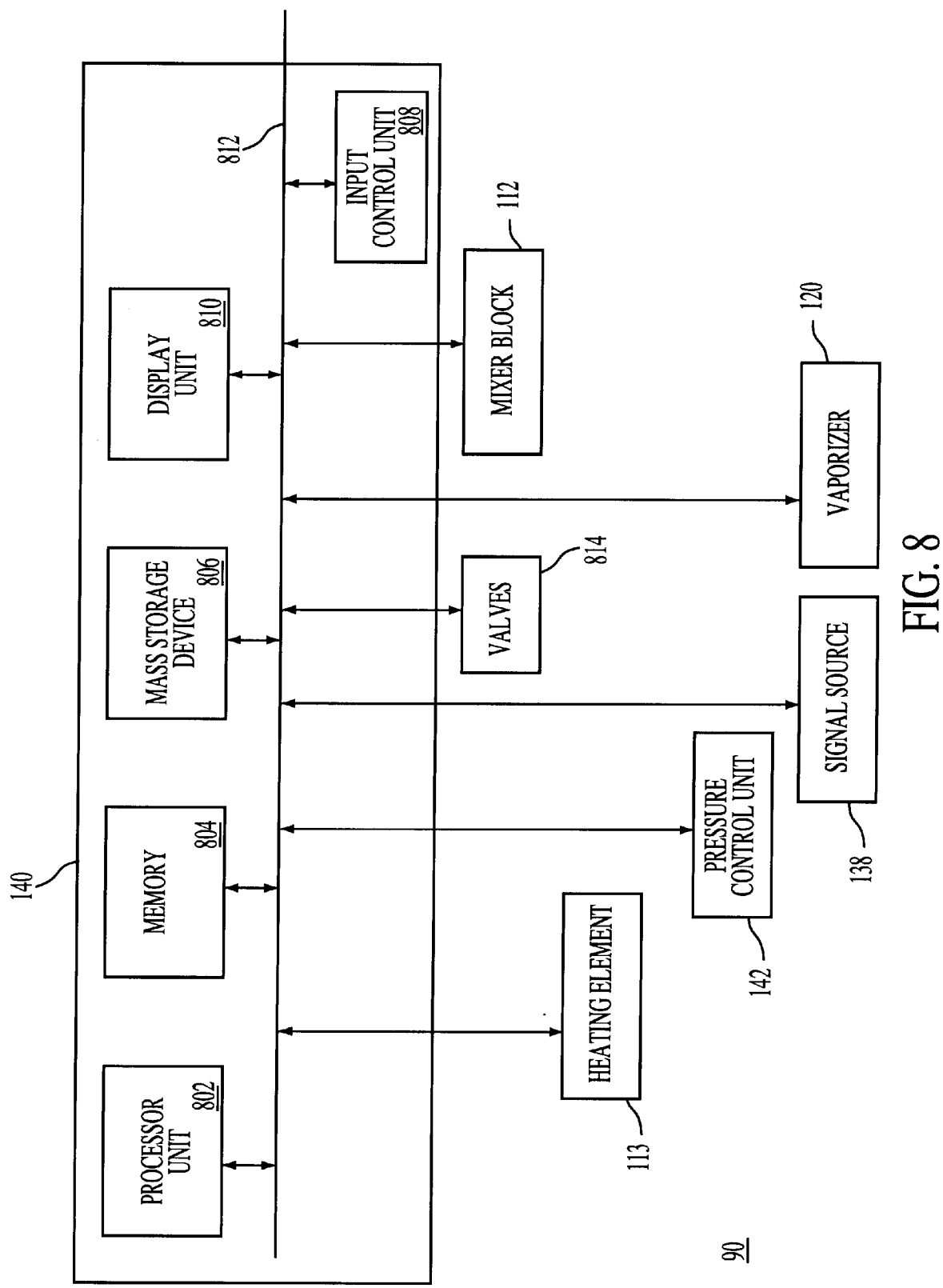
FIG. 8 illustrates a schematic of a control system for operating the deposition system.

The above-described apparatus and process can be performed in a system that is controlled by a processor based control system 140 (FIG. 1). FIG. 8 shows a block diagram of a deposition system 90, such as that depicted in FIG. 1, having such a control system 140 that can be employed in such a capacity. The control system 140 includes a processor unit 802, a memory 804, a mass storage device 806, an input control unit 808, and a display unit 810 which are all coupled to a control system bus 812.

The processor unit 802 forms a general purpose computer that becomes a specific purpose computer when executing programs such as a program for implementing the CVD of copper of the present invention. Although the invention is described herein as being implemented in software and executed upon a general purpose computer, those skilled in the art will realize that the present invention could be operated using hardware such as an application specific integrated circuit ASIC or other hardware circuitry. As such, the invention should be understood as being able to be implemented, in whole or in part, in software, hardware or both.

The processor unit 802 is either a microprocessor or other engine that is capable of executing instructions stored in a memory. The memory 804 can be comprised of a hard disk drive, random access memory ("RAM"), read only memory ("ROM"), a combination of RAM and ROM, or another processor readable storage medium. The memory 804 contains instructions that the processor unit 802 executes to facilitate the performance of the deposition system 90. The instructions in the memory 804 are in the form of program code. The program code may conform to any one of a number of different programming languages. For example, the program code can be written in C+, C++, BASIC, Pascal, or a number of other languages.

The mass storage device 806 stores data and instructions and retrieves data and program code instructions from a processor readable storage medium, such as a magnetic disk or magnetic tape. For example, the mass storage device 806 can be a hard disk drive, floppy disk drive, tape drive, or optical disk drive. The mass storage device 806 stores and retrieves the instructions in response to directions that it receives from the processor unit 802. Data and program code instructions that are stored and retrieved by the mass storage device 806 are employed by the processor unit 802 for operating the deposition system 90. The data and program code instructions are first retrieved by the mass storage device 806 from a medium and then transferred to the memory 804 for use by the processor unit 802.

The display unit 810 provides information to a chamber operator in the form of graphical displays and alphanumeric characters under control of the processor unit 802. The input control unit 808 couples a data input device, such as a keyboard, mouse, or light pen, to the processor unit 802 to provide for the receipt of a chamber operator's inputs.

The control system bus 812 provides for the transfer of data and control signals between all of the devices that are coupled to the control system bus 812. Although the control system bus is displayed as a single bus that directly connects the devices in the processor unit 802, the control system bus 812 can also be a collection of busses. For example, the display unit 810, input control unit 808 and mass storage device 806 can be coupled to an input-output peripheral bus, while the processor unit 802 and memory 804 are coupled to a local processor bus. The local processor bus and input-output peripheral bus are coupled together to form the control system bus 812.

The control system 140 is coupled to the elements of the deposition system 90, employed in copper CVD in accordance with the present invention. Each of these elements is coupled to the control system bus 812 to facilitate communication between the control system 140 and the elements. These elements include the following: a plurality of valves 814 (such as valves 122 and 148 of FIG. 1), the heating element 113, the pressure control unit 142, the signal source 138, vaporizer 120, an optional mixer block 816 (not shown in FIG. 1, but may be connected to either the delivery system 130 or chamber 100). The control system 140 provides signals to the chamber elements that cause these elements to perform operations for forming a layer of copper in the subject apparatus.

In operation, the processor unit 802 directs the operation of the chamber elements in response to the program code instructions that it retrieves from the memory 804. For example, once a wafer is placed in the processing chamber 100, the processor unit 802 executes instructions retrieved from the memory 804 such as activating the heating element 113, controlling valves 814 to produce the desired flow rate of precursor and carrier materials, move susceptor 112 into position for CVD and the like. The execution of these instructions results in the elements of the deposition system 90 being operated to deposit a layer of material on a substrate.

The novel deposition system described above provides for an improved CVD operation by more completely and uniformly vaporizing and dispersing a precursor material in a chamber. Additionally, various features of the deposition system reduce the liklihood of clogging or excessive and undesirable plating that potentially creates particles in the chamber and/or premature failure or excessive maintenance of system components. The improvements provide for lower operating pressures which improve vaporization rate of the precursor material; hence, improves the deposition rate of the material.

Although various embodiments which incorporate the teachings of the present invention have been shown and described in detail herein, those skilled in the art can readily devise many other varied embodiments that still incorporate these teachings.

What is claimed is:

1. Apparatus for performing chemical vapor deposition comprising:
    a deposition chamber having a detachable lid; and
    a vaporizer attached on an outer surface of the detachable lid, wherein the vaporizer is coupled to a shadow plate disposed over a showerhead located within the deposition chamber, said showerhead having a top surface and a plurality of concave segments on said top surface.

2. The apparatus of claim 1 further comprising a valve disposed between the lid and the vaporizer.

3. The apparatus of claim 1 further comprising a precursor delivery system connected between the vaporizer and one or more process material sources.

4. The apparatus of claim 3 wherein the precursor delivery system further comprises a flexible conduction line.

5. The apparatus of claim 4 wherein the flexible conduction line is in the form of a multiple turn coil.

6. The apparatus of claim 5 wherein the flexible conduction line is a thirty (30) turn coil having a diameter of approximately three (3) inches.

7. The apparatus of claim 4 wherein the flexible conduction line is made from stainless steel.

8. The apparatus of claim 4 wherein the flexible conduction line is made from a permeable membrane material.

9. The apparatus of claim 8 wherein the flexible conduction line is encased in a sheath.

10. The apparatus of claim 9 wherein the sheath is connected at a first end to the vaporizer and at a second end to a pressure control unit via a valve.

11. The apparatus of claim 8 wherein the permeable membrane material is selected from the group consisting of a fluorocarbon compound, a fluorocarbon containing compound and PFA 440-HP.

12. The apparatus of claim 3 further comprising one or more conductance lines connected to the flex conduction line and a pre-warm module attached to at least one of conductance lines.

13. The apparatus of claim 12 wherein the pre-warm module warms a precursor material flowing through the conductance lines to a temperature of approximately 40° C.

14. The apparatus of claim 1 further comprising a plurality of orifices in the showerhead and a plurality of orifices in the shadow plate wherein the showerhead orifices are offset from the shadow plate orifices.

15. Apparatus for performing chemical vapor deposition comprising:
    a deposition chamber having a lid; and
    an injection system disposed below the lid within a deposition chamber, wherein the injection system comprises a vaporizer coupled to a shadow plate disposed over a showerhead, said showerhead having a top surface and a plurality of concave segments on said top surface.

16. The apparatus of claim 15 wherein the vaporizer comprises a plurality of injection heads disposed over said shadow plate and said showerhead.

17. A deposition system for performing chemical vapor deposition (CVD) comprising:
    a deposition chamber having a lid;
    a high conductance valve attached to the lid;
    a vaporizer attached to the high conductance valve and;
    a precursor delivery system having at least one conduction line and being attached to the vaporizer wherein the deposition chamber further comprises a showerhead having a top surface with concave portions and a shadow plate disposed above the showerhead, the precursor delivery system having a flex conduction line comprised of a stainless steel coil and a prewarm module communicating with one of the conduction lines.

18. The deposition system of claim 17 wherein the precursor delivery system further comprises a sheath encasing permeable membrane material conduction lines, the sheath connected at a first end to the vaporizer and at a second end to a pressure control unit for degassing a space between the conduction lines and the sheath.

* * * * *

UNITED STATES PATENT AND TRADEMARK OFFICE
CERTIFICATE OF CORRECTION

PATENT NO.    : 6,358,323 B1
DATED         : March 19, 2002
INVENTOR(S)   : Schmitt et al.

It is certified that error appears in the above-identified patent and that said Letters Patent is hereby corrected as shown below:

<u>Title page,</u>
Inventor name, please replace "Xin Shen Guo" with -- Xin Sheng Guo --.

<u>Column 2,</u>
Line 2, please replace "Cupraselect" with -- CUPRASELECT® --.

<u>Column 4,</u>
Line 1, please insert -- of -- after " use".

<u>Column 6,</u>
Line 56, please insert -- ) -- after " CUPRASELECT®"

Signed and Sealed this

Sixth Day of August, 2002

Attest:

Attesting Officer

JAMES E. ROGAN
*Director of the United States Patent and Trademark Office*